United States Patent
Okazaki et al.

(10) Patent No.: US 7,411,569 B2
(45) Date of Patent: Aug. 12, 2008

(54) DISPLAY DEVICE AND METHOD FOR FABRICATING THE SAME

(75) Inventors: Susumu Okazaki, Kawasaki (JP);
Takuya Watanabe, Kawasaki (JP);
Atuyuki Hoshino, Kawasaki (JP)

(73) Assignee: Sharp Kabushiki Kaisha, Osaka (JP)

( * ) Notice: Subject to any disclaimer, the term of this patent is extended or adjusted under 35 U.S.C. 154(b) by 396 days.

(21) Appl. No.: 10/806,780

(22) Filed: Mar. 23, 2004

(65) Prior Publication Data
US 2004/0189213 A1    Sep. 30, 2004

(30) Foreign Application Priority Data
Mar. 31, 2003    (JP) .............................. 2003-093643

(51) Int. Cl.
G09G 3/28    (2006.01)
(52) U.S. Cl. .......................................... 345/56; 345/55
(58) Field of Classification Search ................. 345/76, 345/77, 55, 84, 88; 315/169.1, 169.2, 169.3, 315/169.4
See application file for complete search history.

(56) References Cited

U.S. PATENT DOCUMENTS

| | | | |
|---|---|---|---|
| 5,594,569 A * | 1/1997 | Konuma et al. ............. 349/122 |
| 5,923,962 A * | 7/1999 | Ohtani et al. ............... 438/150 |
| 6,563,482 B1 * | 5/2003 | Yamazaki et al. ............. 345/87 |
| 6,594,064 B2 * | 7/2003 | Hirabayashi ................ 359/253 |
| 6,628,070 B2 | 9/2003 | Van Den Reek et al. |
| 6,724,150 B2 * | 4/2004 | Maruyama et al. ....... 315/169.3 |
| 6,791,256 B2 * | 9/2004 | Nishizawa et al. .......... 313/495 |
| 6,791,521 B2 * | 9/2004 | Isami et al. .................... 345/89 |
| 6,870,186 B2 * | 3/2005 | Park et al. ...................... 257/59 |
| 6,903,731 B2 * | 6/2005 | Inukai ........................ 345/204 |
| 6,950,081 B2 * | 9/2005 | Akimoto et al. ............... 345/55 |
| 7,142,770 B2 * | 11/2006 | Yoshida ...................... 385/147 |
| 7,233,306 B2 * | 6/2007 | Yoshihara et al. ............. 345/94 |
| 2001/0015618 A1 | 8/2001 | Yamazaki et al. ............. 345/87 |

(Continued)

FOREIGN PATENT DOCUMENTS

JP    2001-060076 A    3/2001

(Continued)

OTHER PUBLICATIONS

T. Shimoda et al., "High Resolution Light Emitting Polymer Display Driven by Low Temperature Polysilicon Thin Film Transistor with Integrated Driver", Asia Display 98, pp. 217-220.

(Continued)

Primary Examiner—Douglas W. Owens
Assistant Examiner—Minh Dieu A
(74) Attorney, Agent, or Firm—Greer, Burns & Crain, Ltd.

(57) ABSTRACT

The display device comprises: a substrate 50 having a plurality of light emitting elements on one surface thereof, and a substrate 10 having a circuit for controlling the plurality of the light emitting elements, bonded to said one surface of the substrate 50, and sealing a space where the plurality of the light emitting elements are formed. This makes it possible to form the light emitting elements on a flat surface, and the degradation of the emission characteristics of the light emitting elements can be prevented. The aperture ratio and the luminance of the display device can be also increased.

13 Claims, 15 Drawing Sheets

U.S. PATENT DOCUMENTS

| | | | |
|---|---|---|---|
| 2002/0158577 A1 | 10/2002 | Shimoda et al. | 345/87 |
| 2003/0111666 A1* | 6/2003 | Nishi et al. | 257/79 |
| 2004/0079937 A1* | 4/2004 | Miyazawa | 257/10 |
| 2005/0225238 A1* | 10/2005 | Yamazaki | 313/506 |

FOREIGN PATENT DOCUMENTS

| | | |
|---|---|---|
| JP | 2001-147659 A | 5/2001 |
| JP | 2001-236025 | 8/2001 |
| JP | 2002-82633 | 3/2002 |
| KR | 2002-0084084 | 11/2002 |

OTHER PUBLICATIONS

M.T. Johnson et al., Active Matrix Poly LED Display, IDW '00, pp. 235-238.

T. Sasoaka et al., "A 13.0-inch AM-OLED Display with Top Emitting Structure and Adaptive Current Mode Programmed Pixel Circuit (TAC)", SID 2001, pp. 384-386.

* cited by examiner

LIGHT

DISPLAY DEVICE AND METHOD FOR FABRICATING THE SAME

CROSS-REFERENCE TO RELATED APPLICATIONS

This application is based upon and claims the benefit of priority from the prior Japanese Patent Application No. 2003-093643, filed on Mar. 31, 2003, the entire contents of which are incorporated herein by reference.

BACKGROUND OF THE INVENTION

The present invention relates to a display device and a method for fabricating the same, more specifically a self-emission type display device using an electroluminescence (EL) element, etc., and a method for fabricating the same.

An active matrix type display device includes a plurality of switching elements and pixels respectively operated by the switching elements, which are formed in a matrix on a transparent insulating substrate.

The typical active-matrix type display device is represented by liquid crystal display device. The liquid crystal display device includes a liquid crystal filled between one substrate having the switching elements and another substrate opposed thereto and controls the liquid crystal by the switching elements to use the liquid crystal as shutters.

As display devices other than the liquid crystal display device are known self-emission type display devices, such as EL (electroluminescence) displays, FED (field emission displays) etc. In the EL display, light emitting elements of an inorganic or an organic material connected to the switching elements are caused to emit the light, no liquid crystal material is required to be filled, and no substrate to be opposed to the light emitting elements is required. The FED uses light generated when electrons from electron emitting devices are caused to impinge upon a fluorescent object provided on an opposed substrate.

Among such active matrix type display devices is recently noted a display device using organic electroluminescence elements (organic EL elements) as active driven elements, and polycrystalline silicon TFTs as the switching elements. The EL element, which is different from liquid crystal devices using as shutters the liquid crystal molecules sandwiched between two substrates, self-emits the light, and has the advantages that the EL does not have visual field angle dependency, and can be completed with one substrate and can be accordingly thinner and lighter than the liquid crystal display device, and other advantages. In the active drive, the EL element can be caused to emit the light continuously during 1 frame, and the emission period of time can be made long. Thus, emission qualities, such as luminance, etc., can be high, and the emission period of time is long, whereby the current which instantaneously flows can be small, and the lifetime can be long.

A display device using the organic EL element will be explained below with reference to FIGS. 13 and 14. The display devices using the organic EL elements are classified depending on directions of emission of light in bottom emission type, which emits light toward the side of the substrate with the switching elements formed on and in top emission type, which emits light toward the side opposite to the substrate with the switching elements formed on. The bottom emission type-display devices are described in, e.g., Reference 1 (T. Shimodaet al., "High resolution light emitting polymer display driven by low temperature polysilicon thin film transistor with integrated driver", ASIA DISPLAY 98, pp. 217-220) and Reference 2 (M. T. Johnson et al., "Active matrix poly LED display", IDW'00, pp. 235-238). The top emission-type display devices are described in, e.g., Reference 3 (Japanese published unexamined patent application No. 2001-0600076), Reference 4 (Japanese published unexamined patent application No. 2001-147659), and Reference 5 (T. Sasaoka et al., "A 13.0-inch AM-OLED display with top emitting structure and adaptive current mode programmed pixel circuit (TAC)", SID 2001, pp. 384-386).

FIG. 13 shows the conventional bottom emission type display device.

A channel layer 102 of polycrystalline silicon film is formed on a transparent substrate 100. A gate electrode 106 is formed on the channel layer 102 with a gate insulating film 104 interposed therebetween. A source region 108 and a drain region 110 are formed in the channel layer 102 on both sides of the gate electrode 106. Thus, a thin-film transistor (TFT) having the channel of polycrystalline silicon is constituted. An inter-layer insulating film 112 is formed on the transparent substrate 100 with the thin film transistor formed on. Contact holes 114, 116 are formed in the inter-layer insulating film 112 down to the source region 108 and the drain region 110. On the inter-layer insulating film 112, a source electrode 118 and a drain electrode 120 are formed, respectively connected to the source region 108 and the drain region 110 through the contact holes 114, 116.

An inter-layer insulating film 122 is formed on the inter-layer insulating film 112 with the source electrode 118 and the drain electrode 120 formed on. A contact hole 124 is formed in the inter-layer insulating film 122 down to the drain electrode 120.

An anode electrode 126 electrically connected to the drain electrode 120 through the contact hole 124, a hole transporting layer 128, a light emitting layer 130, an electron transporting layer 132 and a cathode electrode 134 are sequentially laid on the inter-layer insulating film 122. Thus, an organic EL element connected to the TFT is constituted. In the bottom emission type display device, in which light is emitted downward of the transparent substrate 100, the anode electrode 126 is formed of a transparent electrode material, e.g., ITO or others, and the cathode electrode 134 is formed of a high reflectance material, e.g., aluminum.

A protection layer 136 is formed on the transparent substrate 100 with the TFT and the organic EL element formed on. Usually, a glass substrate is used as the protection layer 136. A sealing compound 138 is provided, surrounding the device forming region between the inter-layer insulating film 122 and the protection layer 136, so as to protect the organic EL element from the outside water, etc.

FIG. 14 shows the top-emission type display device.

As shown in FIG. 14, the top emission type display device is the same as the bottom emission type display device in the basic structure. The top emission type display device is different from the bottom emission type display device in that the layer structure of the organic EL element thereof is opposite to that of the bottom emission type display device.

That is, in the top emission type display device, a cathode 134 electrically connected to the drain electrode 120 through the contact hole 124, the electron transporting layer 132, the light emitting layer 130, the hole transporting layer 128 and the anode electrode 126 are sequentially formed on the inter-layer insulating film 122. In the top emission type display device, in which light is emitted upward of the transparent substrate 100, a transparent electrode material, e.g., ITO or others is used as the anode electrode 126, and a high reflectance material, e.g., aluminum or others is used as the cathode electrode 134.

Pixels 140 each comprising one TFT and one organic EL element as described above are arranged in a matrix on the transparent substrate 100 as shown in FIG. 15. On the transparent substrate 100 there are formed a plurality of data bus lines 142 commonly connected the source electrodes 118 of the TFTs of the pixels adjacent to each other in the direction of the columns as viewed in the drawing, and a plurality of scan bus lines 144 commonly connecting the gate electrodes 106 of the TFTs of the pixels adjacent to each other in the direction of the rows as viewed in the drawing. At the periphery of the pixel region, a data control circuit 146 connected to the data bus lines 142 and a gate control circuit 148 connected to the scan bus lines 144. The data control circuit 146 and the gate control circuit 148 are connected to a flexible printed circuit board 150 which connects the former to an outside circuit board including a drive circuit, etc.

The above-described display device is used widely as monitors such as 1) stand alone monitors and monitors built in devices, walls, etc., 2) monitors having the displays folded inside as in notebook type personal computers, etc., 3) monitors of mobile devices, such as portable telephones, etc., and 4) tablet PCs and liquid crystal TVs. The unit forming the devices described above in 1) to 4) is called a module: a) a display substrate with the EL elements mounted on, b) a printed circuit board (outside circuit substrate) with control circuits, etc. mounted, which is connected to a display substrate with a freedom degree of bending, etc., and others which are accommodated compact in an outer frame called a bezel.

As methods for connecting the display substrate and the outside circuit substrate are 1) the method of connecting the circuit substrate mounted on a printed circuit board, etc. and the display substrate by the flexible printed circuit board with an anisotropic conducting resin, solder or others, 2) TAB (Tape Automated Bonding) and COF (Chip On Film), which mount parts of circuits mounted on a flexible printed circuit board or a film substrate to connect the same to the periphery of the display substrate, 3) COG (Chip On Glass), which mounts semiconductor devices directly on the display substrate, etc. The printed circuit boards with circuits mounted, which are common with these methods, are connected to the display substrates by the flexible films with freedom degrees of bending or others. In COG, the semiconductor elements are mounted on the display substrate in a region other than the pixel region.

SUMMARY OF THE INVENTION

In the above-described conventional bottom emission type display device, in which light is emitted toward the transparent substrate 100 with TFTs and interconnections formed on, the TFTs and interconnections restrict the aperture ratio, and the part occupied by the TFTs and interconnections cannot contribute to the emission at all. On the other hand, in the above-described conventional top emission type display device, in which light is emitted oppositely to the transparent substrate 100 with TFTs formed on, EL devices are allowed to be extended up to above the TFTs to form the light emitting surface, with a result of high aperture ratio. However, surface roughness caused by the TFTs, the interconnections, etc. are reflected in the surface where the EL elements are formed on, with a result of degraded emission characteristics of the EL elements.

In connection with the outside circuits connected to the display substrate, it is required to reduce the mounted space for peripheral circuits, such as a low current drive circuit, a timing generating circuit, a CPU, etc. and reduce delay of signals and noises of electromagnetic waves and others.

An object of the present invention is to provide a display device which can make the fabrication steps simple and is of high performance with high aperture ratio and high luminance, and a method for fabricating the same. Another object of the present invention is to provide a display device which can reduce the distance of interconnection between the mounted space and the display substrate, and the outside circuit substrate, and a method for fabricating the same.

According to one aspect of the present invention, there is provided a display device comprising: a first substrate having a plurality of light emitting elements on one surface thereof; and a second substrate having a circuit for controlling the plurality of the light emitting elements, bonded to said one surface of the first substrate, and sealing a space where the plurality of the light emitting elements are formed.

According to another aspect of the present invention, there is provided a method for fabricating a display device comprising the steps of: forming a plurality of light emitting elements on one surface of a first substrate; forming a plurality of switching elements on one surface of a second substrate; bonding said one surface of the first substrate and said one surface of the second substrate to each other and electrically connecting said respective plurality of the light emitting elements to the respective plurality of the switching elements.

According to further another aspect of the present invention, there is provided a method for fabricating a display device comprising the steps of: forming on one surface of a first substrate a plurality of light emitting elements and a plurality of switching elements electrically connected to said respective plurality of the light emitting elements; forming on one surface of a second substrate a prescribed circuit which is to be electrically connected to said plurality of switching elements; and bonding the first substrate and the second substrate to each other with said one surface of the first substrate and said one surface of the second substrate opposed to each other to electrically connect the circuit to the plurality of the switching elements.

According to the present invention, light emitting devices are formed on a substrate different from a substrate for switching elements to be formed on, and these substrates are bonded to each other to fabricate the display device, whereby the light emitting elements can be formed on a flat surface without being affected by surface steps formed by the switching elements. Accordingly, even the layout of laying the switching element forming region and the light emitting elements forming region on each other can prohibit the emission characteristics of the light emitting elements. Thus, the display device can have high aperture ratio, and can have high luminance.

The substrate for the light emitting devices to be formed on can be utilized as the protection film for shutting the light emitting elements from the moisture in the outside atmosphere, etc., whereby a number of the fabrication steps as a whole is not increased. Oppositely, the 2 substrates can be prepared separately in parallel, whereby the fabrication period of time can be shortened, and the yield can be expected to increase. The switching elements and the light emitting elements are not required to be fabricated in one and the same process, which permits the fabrication process itself to be simplified.

The display device including the display unit and the drive unit and having the protection function for protecting the light emitting elements from the moisture in the outside atmosphere is comprises two substrates, which allows the display device to be compact, and the mounting space can be much reduced. The display substrate and the circuit substrate are laid on each other and wired with each other, which allows the wiring length to be shortened. Thus, the signal delay of the wiring and noises of electromagnetic waves and others can be reduced.

DETAILED DESCRIPTION OF THE INVENTION

A First Embodiment

The display device and a method for fabricating the same according to a first embodiment of the present invention will be explained with reference to FIGS. 1 to 4B.

Figure 1:
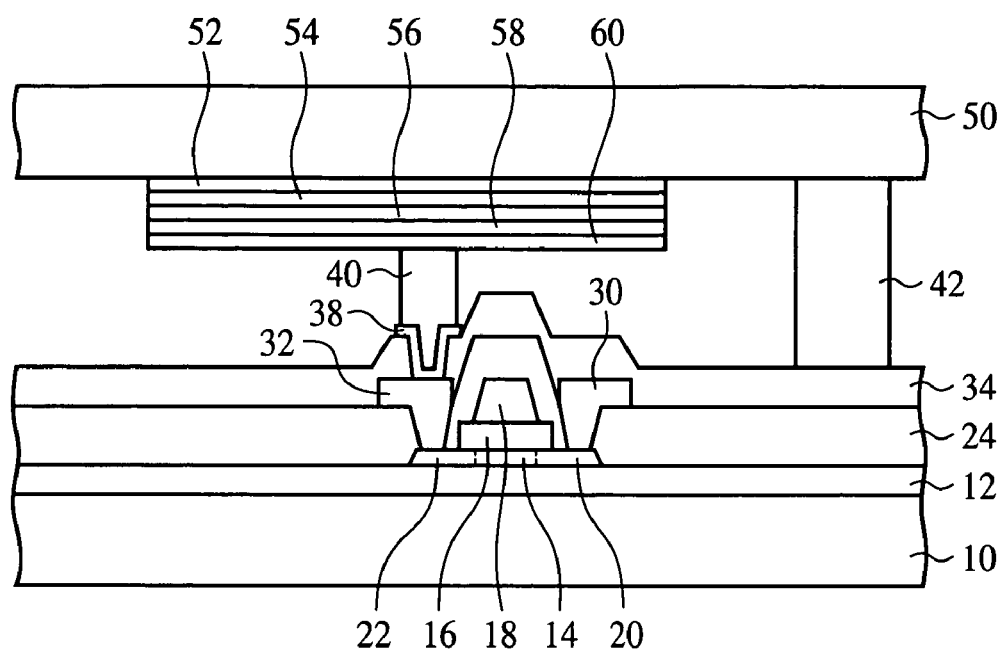
FIG. 1 is a diagrammatic sectional view of the display device according to a first embodiment of the present invention, which shows a structure thereof.

FIG. 1 is a diagrammatic sectional view of the display device according to the present embodiment, which show a structure thereof. FIGS. 2A to 4B are sectional views of the display device according to the present embodiment in the steps of the method for fabricating the same, which show the method.

First, the structure of the display device according to the present embodiment will be explained with reference to FIG. 1. FIG. 1 shows the structure of 1 pixel, but actually a plurality of the pixels are arranged in a matrix.

A buffer layer 12 is formed on a transparent substrate 10. A channel layer 14 is formed on the buffer layer 12. A gate electrode 18 is formed on the channel layer 14 with a gate insulating film 16 interposed therebetween. A source region 20 and a drain region 22 are formed in the channel layer 14 respectively on both sides of the gate electrode 18. Thus, a thin film transistor (TFT) including the gate electrode 18, the source region 20 and the drain region 22 formed in the channel layer 14 is constituted.

An inter-layer insulating film 24 is formed on the transparent substrate 10 with the TFT formed on. On the inter-layer insulating film 24, a source electrode 30 and a drain electrode 32 are formed, connected respectively to the source region 20 and the drain region 22 through contact holes.

An inter-layer insulating film 34 is formed on the inter-layer insulating film 24 with the source electrode 30 and the drain electrode 32 formed on. On the inter-layer insulating film 34, a leading electrode 38 is formed, connected to the drain electrode 32 through a contact hole. A columnar electrode 40 is formed on the leading electrode 38.

An organic EL element including an anode electrode 52, a hole transporting layer 54, a light emitting layer 56, an electron transporting layer 58 and a cathode electrode 60 is formed on a transparent substrate 50.

The transparent substrate 10 and the transparent substrate 50 are laid on each other with the columnar electrode 40 and the cathode electrode 60 connected to each other. Between the inter-layer insulating film 34 formed on the transparent substrate 10 and the transparent substrate 50, a sealing compound 42 is provided, surrounding the pixel region, and the pixel region is sealed. The organic EL element is thus shut from water, etc. outside.

As described above, the display device according to the present embodiment is characterized mainly in that the substrate (transparent substrate 10) with the switching element (TFT) and the interconnection layers formed on, and the substrate (transparent substrate 50) with the organic EL element formed on are bonded to each other.

The organic EL element and the switching element are formed respectively on the different substrates, whereby the organic EL element can be formed on a flat surface without being affected by the surface step formed by the switching element. Accordingly, in the top emission type display device, even when the switching element forming region and the organic EL element forming region are arranged to lay on each other, degradation of the emission characteristics of the organic EL element can be prevented. Accordingly, the display device can have higher aperture ratio and can have high luminance.

In the display device using organic EL elements, a protection film must be formed on the organic EL elements so as to shut the EL elements from the outside atmosphere. To this end, in the display device according to the present embodiment, the sealing compound 42 is provided between the transparent substrate 10 and the transparent substrate 50. Thus, the transparent substrate 50 can be used as the protection film.

Next, the method for fabricating the display device according to the present embodiment will be explained with reference to FIGS. 2A to 4B.

A silicon oxide film of, e.g., a 400 nm-thick is deposited on the transparent substrate 10 of glass or others by, e.g., CVD method to form the buffer layer 12 of the silicon oxide film.

Next, a polycrystalline silicon film of, e.g., a 40 nm-thick is deposited on the buffer layer 12 by, e.g., CVD method. In place of depositing polycrystalline silicon film, amorphous silicon film may be deposited and crystallized by laser annealing or others to form polycrystalline silicon film.

Figure 2A:
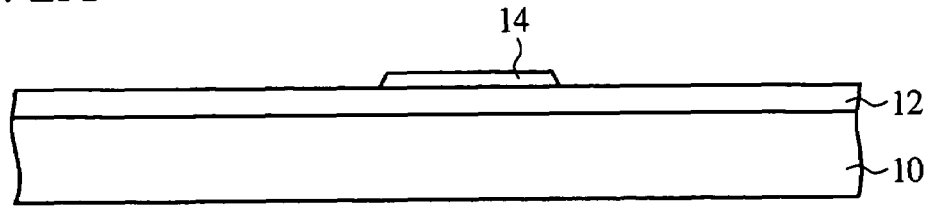
FIGS. 2A-2D, 3A-3C and 4A-4B are sectional views of the display device according to the first embodiment of the present invention in the steps of the method for fabricating the same, which show the method.

Next, the polycrystalline silicon film is patterned by photolithography and dry etching to form the channel layer 14 of the polycrystalline silicon film (FIG. 2A).

Next, a silicon oxide film of, e.g., a 110 nm-thick is deposited by, e.g., CVD method.

Then, an Al—Nd film of, e.g., a 300 nm-thick and having a 2 at % Nd content is deposited.

Then, the Al—Nd film and the silicon oxide film are patterned by photolithography and dry etching to form the gate insulating film 16 of the silicon oxide film and the gate electrode 18 of the Al—Nd film on the channel layer 14. Although not shown, in the active matrix type display device, a scan bus line may be formed of the same conducting layer as the gate electrode 18.

Then, with the gate electrode 24 as the mask, phosphorus (P) ions, for example, are implanted to form the source region 20 and the drain region 22 in the channel layer respectively on both sides of the gate electrode 18.

Figure 2B:
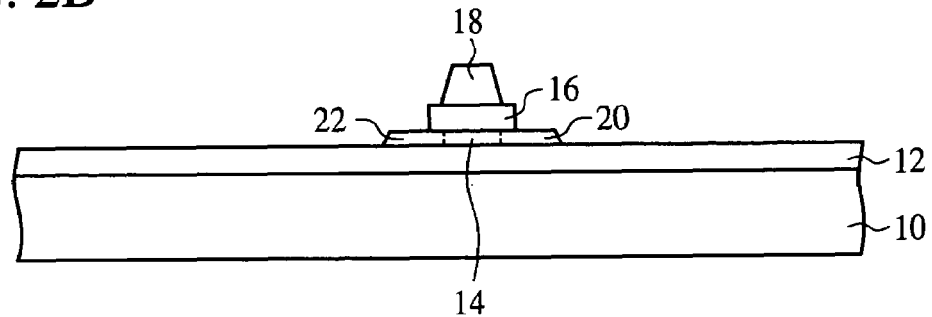

Thus, the TFT including the gate electrode 18, and the source region 20 and the drain region 22 formed in the channel layer 14 of polycrystalline silicon can be fabricated (FIG. 2B).

Then, a silicon oxide film of, e.g., a 400 nm-thick is deposited by, e.g., CVD method on the transparent substrate 10 with the TFT formed-on to form an inter-layer insulating film 24.

Figure 2C:
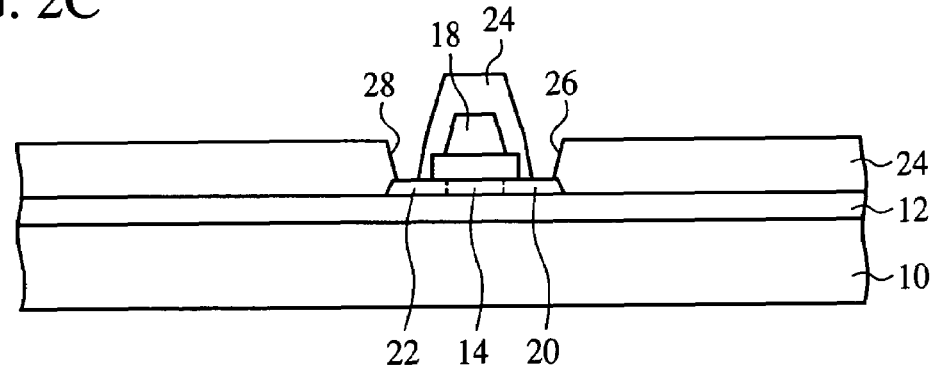

Next, the inter-layer insulating film 24 is patterned by photolithography and dry etching to form the contact holes 26, 28 respectively down to the source region 20 and the drain region 22 (FIG. 2C).

Then, on the inter-layer insulating film 24, a titanium (Ti) film of, e.g., a 100 nm-thick and an aluminum (Al) film of, e.g., a 200 nm-thick and a titanium film of, e.g., a 50 nm-thick are deposited by, e.g., sputtering method.

Figure 2D:
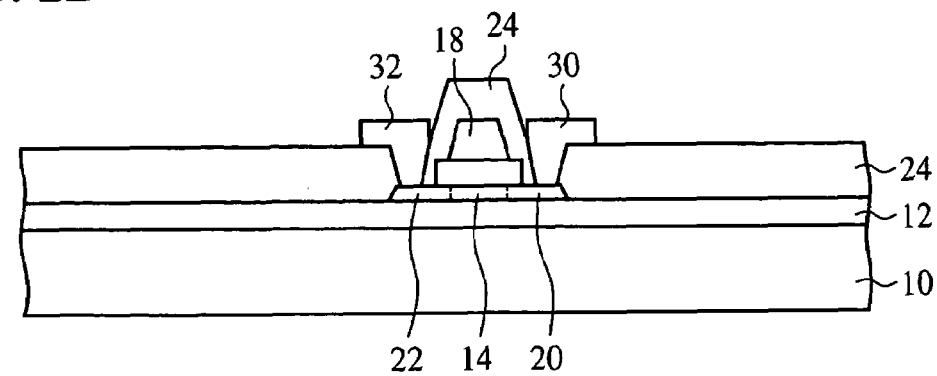

Next, the layer film of the Ti/Al/Ti structure is patterned by photolithography and dry etching to form the source electrode 30 and the drain electrode 32 of the layer film of the Ti/Al/Ti structure connected to the source region 20 and the drain region 22 through the contact holes 26, 28 (FIG. 2D). Although not shown, in the active matrix type display device, data bus lines can be formed of the same conducting layer as the source electrode 30.

Then, a silicon nitride film of, e.g., a 300 nm-thick is deposited by, e.g., CVD method on the inter-layer insulating film 24 with the source electrode 30 and the drain electrode 32 formed on.

Figure 3A:
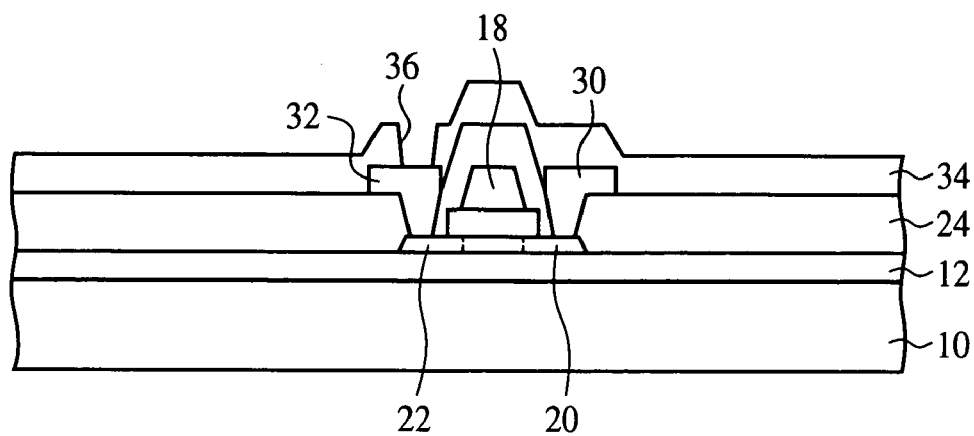

Next, the inter-layer insulating film 34 is patterned by photolithography and dry etching to form the contact hole 36 down to the drain electrode 32 (FIG. 3A).

Then, an aluminum film of, e.g., a 200 nm-thick is formed on the inter-layer insulating film 34 by, e.g., sputtering method.

Next, the aluminum film is patterned by photolithography and dry etching to form the leading electrode 38 formed of the aluminum film and connected to the drain electrode 32 through the contact hole 36.

Figure 3B:
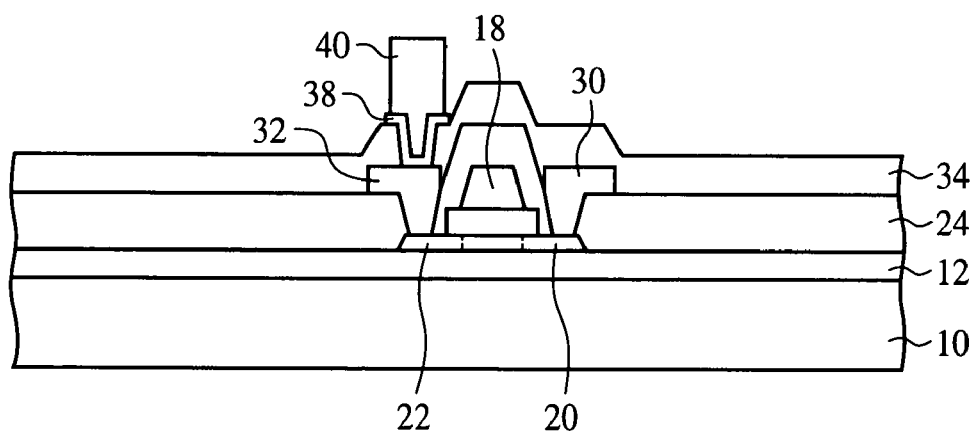

Then, a conducting resist film is formed on the inter-layer insulating film 34 with the leading electrode 38 formed on and then patterned by photolithography to form the columnar electrode 40 of the conducting resist film on the leading electrode 38 (FIG. 3B).

In a process different from the above-described process for forming the elements including TFT, etc. on the transparent substrate 10, an ITO film of, e.g., a 100 nm-thick is formed on the transparent substrate 50 of glass by, e.g., sputtering method. Then, on the ITO film, an NPD (diphenyldiamine) film of, e.g., a 10 nm-thick, an Alq$_3$ (quinolinol aluminum complex) of, e.g., a 10 m-thick doped with a required luminescent material, and an Alq$_3$ film of, e.g., a 20 nm-thick are formed by, e.g., evaporation method. Then, on the Alq$_3$ film, an aluminum film of, e.g., a 100 nm-thick is deposited by PVD (Physical Vapor Deposition), e.g., evaporating method.

Figure 3C:
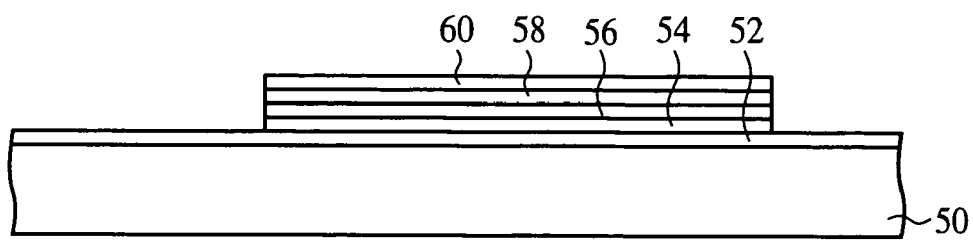

Then, these films are patterned into a prescribed pixel configuration for form on the transparent substrate 50 the organic EL element excluding the anode electrode 52 of the ITO film, including the hole transporting layer 54 of the NPD film, the light emitting layer 56 of the doped Alq$_3$ film with a required luminescent material, the electron transporting layer 58 of the Alq$_3$ layer and the cathode electrode 60 of the aluminum film is fabricated (FIG. 3C).

Figure 4A:
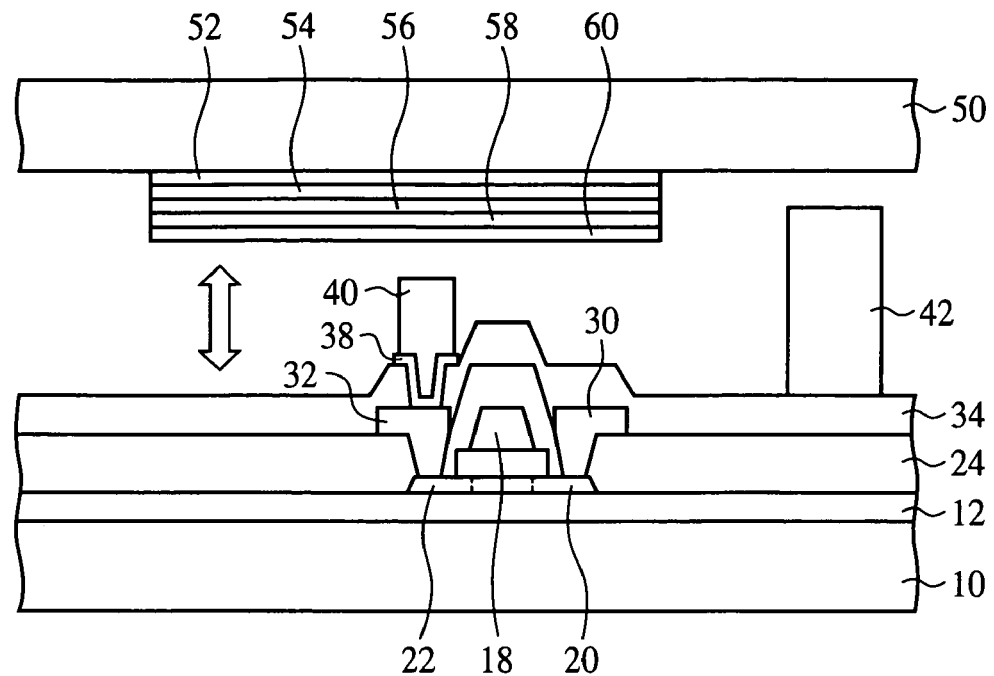
Figure 4B:
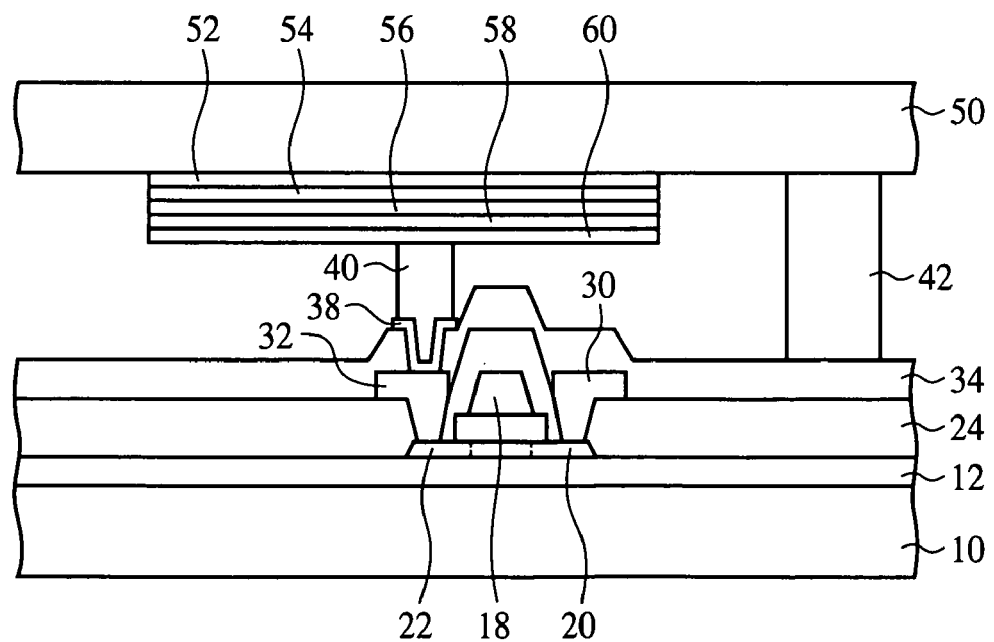

Then, the surface of the transparent substrate 10 on which the elements of TFT, etc. are formed on, and the surface of the transparent substrate 50, on which the organic EL element is formed on are opposed to each other to lay on each other with the columnar electrode 40 and the cathode electrode 60 connected with each other. At this time, the sealing compound 42 has been applied to the inter-layer insulating film 34, enclosing the pixel region, so that after the transparent substrate 10 and the transparent substrate 50 are laid on each other, the pixel region is shut off from the outside (FIGS. 4A and 4B).

The sealing compound 42, e.g., a photo-sensitive resin having the moisture proofness function is applied with a dispenser or others and is set by light irradiation after the transparent substrate 10 and the transparent substrate 50 have been laid on each other. For the effective prevention of the affection of the moisture in the outside atmosphere, preferably a gas containing no moisture or a drying agent is sealed inside the seal.

Thus, the display device shown in FIG. 1 is fabricated.

The fabrication method comprising the above-described string of steps can fabricate in parallel the elements to be formed on the transparent substrate 10, and the elements to be formed on the transparent substrate 50, whereby the fabrication period of time can be short. Furthermore, it is not necessary to form the active drive element and the organic EL element on the same substrate, whereby the fabrication steps can be simpler in comparison with the method of fabricating the conventional display device.

As described above, according to the present embodiment, display device is fabricated by forming the organic EL element on a substrate which is different from the substrate for the switching element to be formed on and bonding these substrate, whereby the organic EL element can be formed on a flat surface without being affected by a surface step formed by the switching element. Accordingly, even the layout in which the switching element formed region and the organic EL element formed region are overlapped each other can prohibit the degradation of the emission characteristics of the organic EL element. Thus, the aperture ratio of the display device can be high, and the luminance can be high.

The substrate with the organic EL element formed on can be utilized as the protection film for shutting the organic EL element from the moisture in the outside atmosphere, which does not increase the fabrication step number as a whole. Oppositely, the two substrates can be formed independently in parallel, which shortens the fabrication period of time, and yield increase can be expected. It is not necessary to fabricate the TFT and the organic EL element in one and the same process, which can simplify the fabrication process itself.

In the present embodiment, the TFT and the organic EL element are electrically connected by one columnar electrode 40. However, both may be electrically connected by a plurality of the columnar electrodes 40, which ensures the electrical connection between the TFT and organic EL element.

Figure 5:
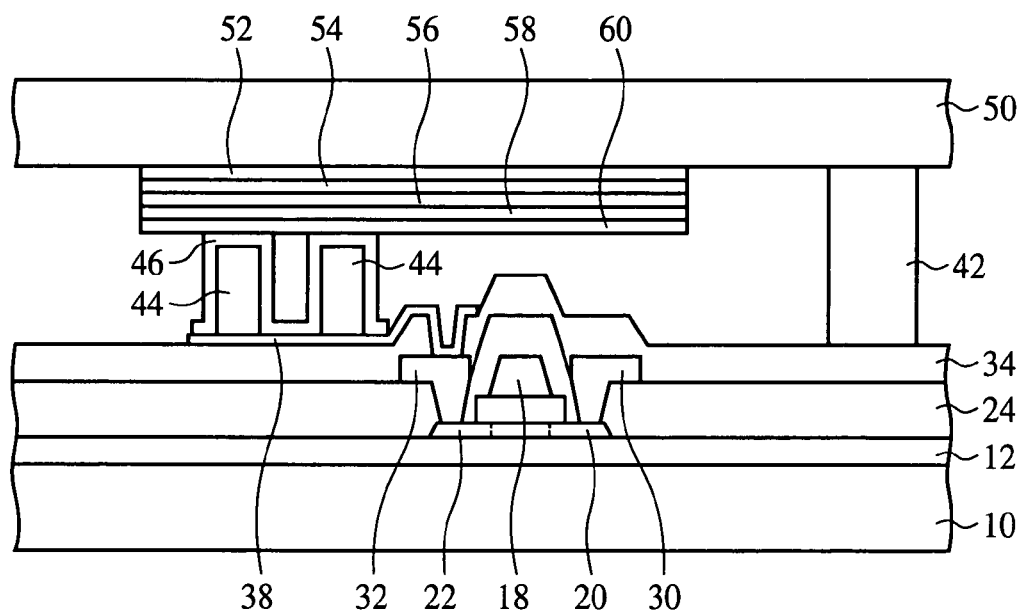
FIG. 5 is a diagrammatic sectional view of the display device according to a modification of the first embodiment of the present invention, which shows a structure thereof.

In the present embodiment, the columnar electrode is formed by using conducting resist. However, a structure for electrically connecting the TFT and the organic EL element can be formed by using non-conducting resist. As exemplified in FIG. 5, the conducting structure projected in columns on the transparent substrate 10 can be formed by forming columnar bodies 44 of a non-conducting resist on the leading electrode 38 and then forming a conducting thin film 46 of, e.g., aluminum over the columnar bodies 44, connected to the leading electrode 38.

A Second Embodiment

The display device and the method for fabricating the same according to a second embodiment of the present invention will be explained with reference to FIGS. 6 and 7. The same members of the present embodiment as those of the display device and the method for fabricating the same according to the first embodiment shown in FIGS. 1 to 5 are represented by the same reference numbers not to repeat or to simplify their explanation.

Figure 6:
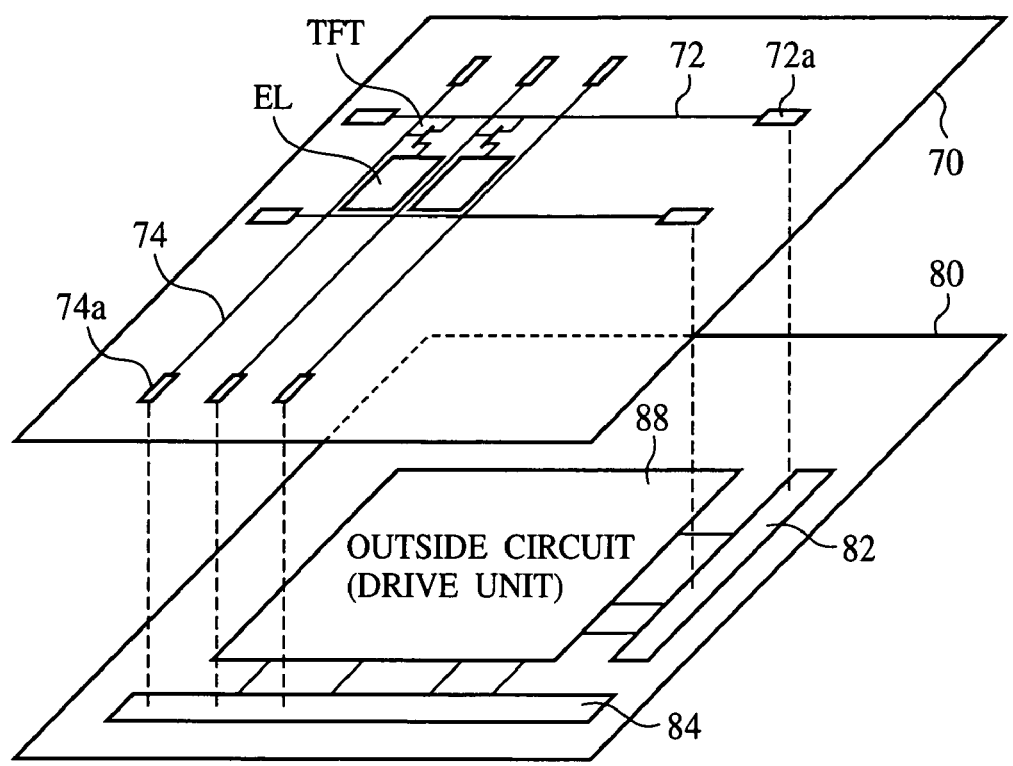
FIG. 6 is a perspective view of the display device according to a second embodiment of the present invention, which shows a structure thereof.

FIG. 6 is a perspective view of the display device according to the present embodiment, which shows a structure thereof. FIG. 7 is a diagrammatic sectional view of the display device according to the present embodiment, which shows the structure thereof.

Figure 15:
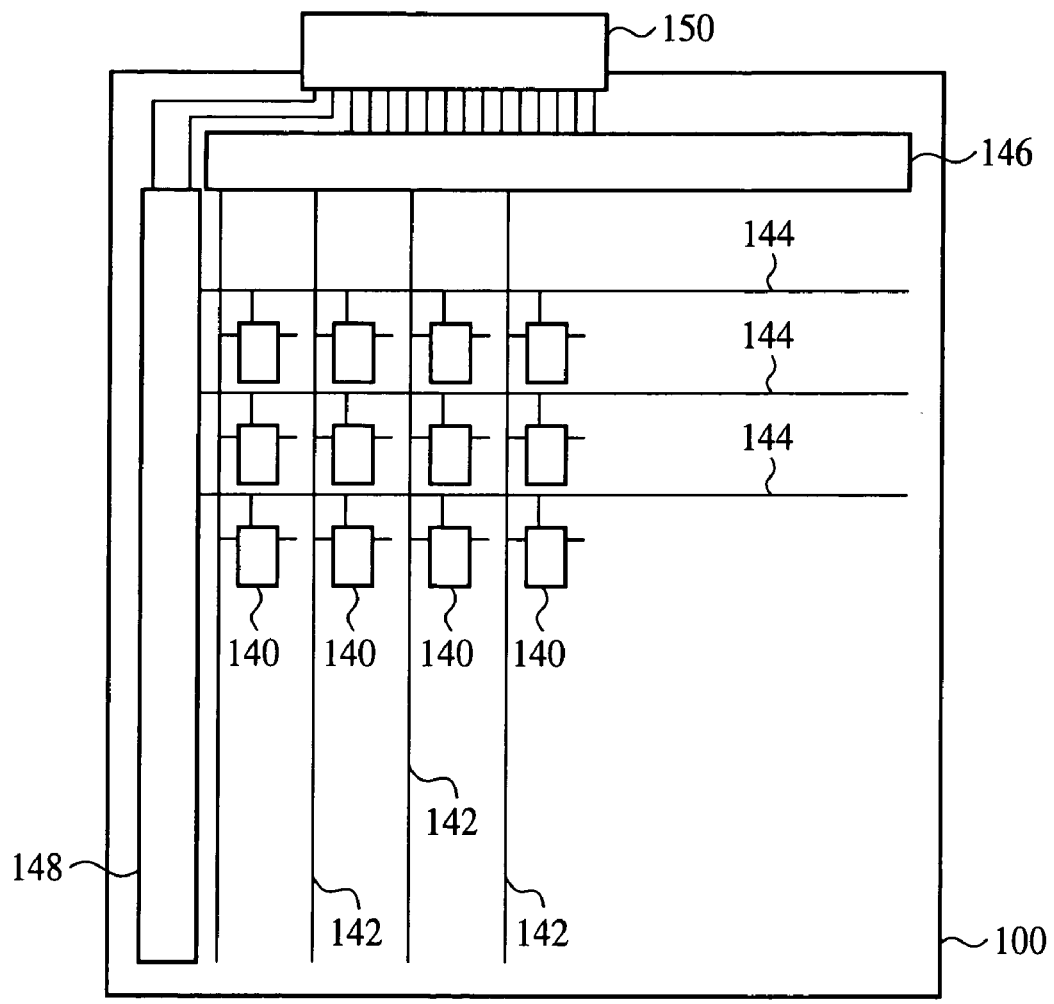
FIG. 15 is a plan view of the conventional display device, which shows-the structure thereof.

As shown in FIG. 15, in the conventional display device, the display substrate is connected to the outside circuit printed substrate (not shown) with the flexible substrate 150 or others connected to the transparent substrate 100. Accordingly, the display device including the drive circuit unit as a whole has can have a larger number of substrate parts and a longer wiring length. In the present embodiment, the display device which allows the substrate parts including the drive circuit unit to be mounted on a smaller space, and can realize reduction of signal delay of the wiring and noises of electromagnetic waves and others will be explained.

As shown in FIG. 6, the display device according to the present embodiment comprises a display substrate 70 and an outside circuit substrate 80 bonded to each other, the former including switching elements TFT and organic EL elements EL connected to the switching elements TFT which are disposed at the respective intersections of bus lines arranged in a matrix, and the latter including a circuit for driving the display substrate 70.

Figure 13:
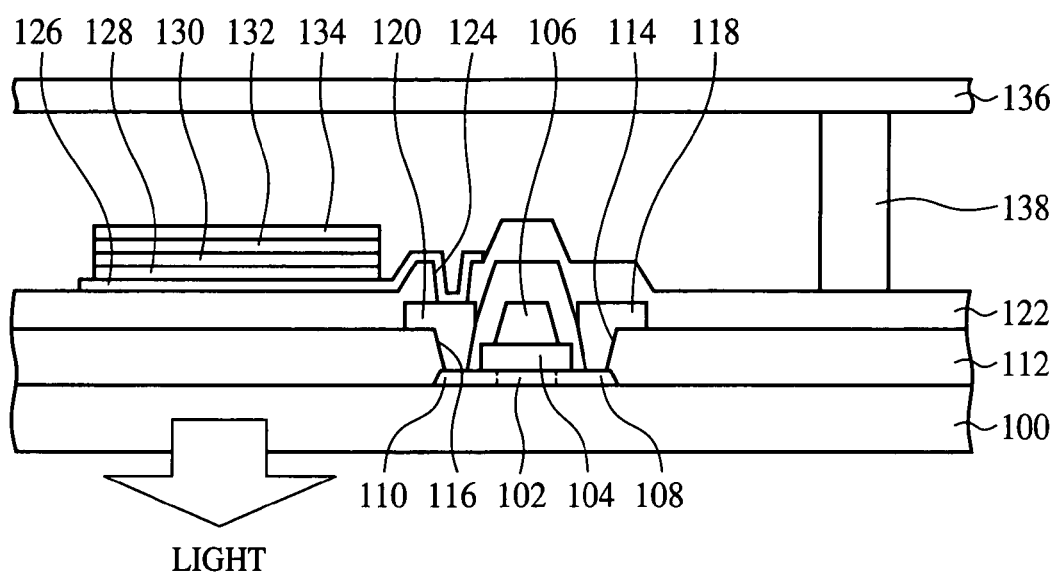
FIGS. 13 and 14 are diagrammatic sectional views of the conventional display devices, which show the structures thereof.
Figure 14:
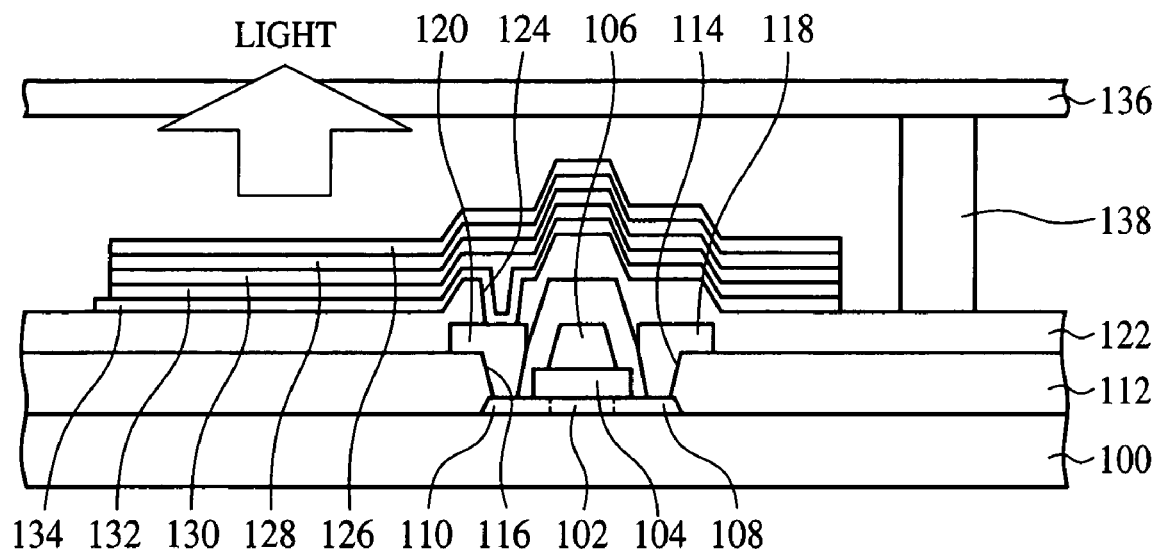

The display substrate 70 is the same as that of the conventional bottom emission type display device show in FIG. 13 except that no protection film is formed in the former.

Figure 7:
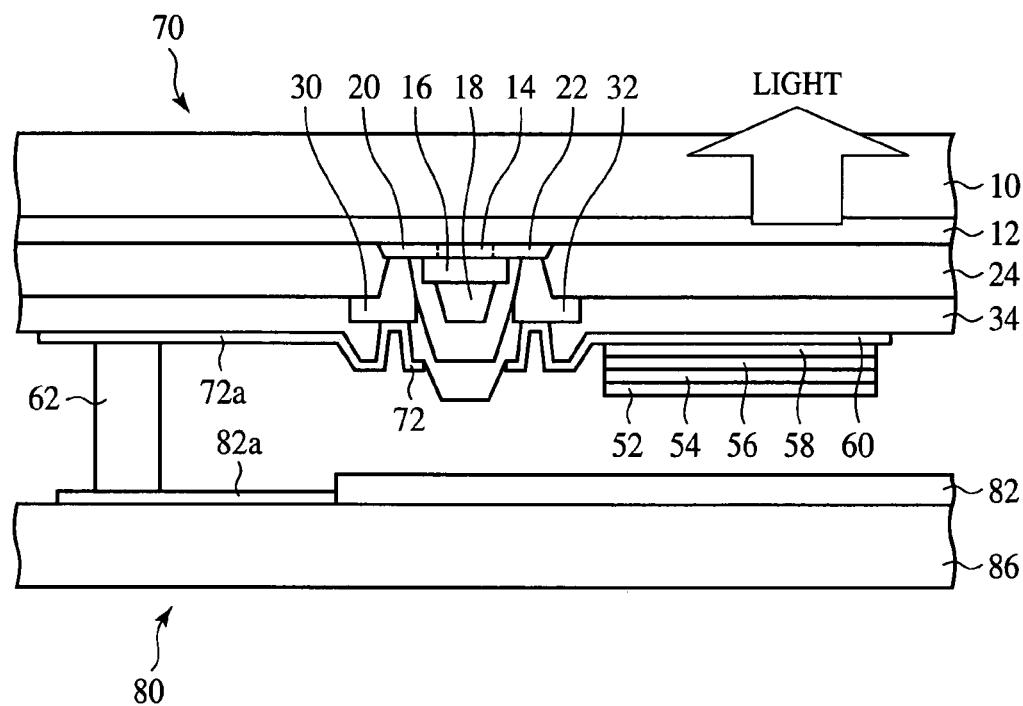
FIG. 7 is a diagrammatic sectional view of the display device according to the second embodiment of the present invention, which shows a structure thereof.

That is, as shown in FIG. 7, a buffer layer 12 is formed on a transparent substrate 10. A channel layer 14 is formed on the buffer layer 12. A gate electrode 18 is formed on the channel layer 14 with a gate insulating film 16 interposed therebetween. A source region 20 and a drain region 22 are formed in the channel layer 14 respectively on both sides of the gate electrode 18. Thus, on the transparent substrate 10, a TFT including the gate electrode 18, and the source region 20 and the drain region 22 formed in the channel layer 14 is formed.

An inter-layer insulating film 24 is formed on the transparent substrate 10 with the TFT formed on. On the inter-layer insulating film 24 a source electrode 30 and a drain electrode 32 are formed, connected respectively to the source region 20 and the drain region 22.

An inter-layer insulating film 34 is formed on the inter-layer insulating film 24 with the source electrode 30 and the drain electrode 32 formed on. On the inter-layer insulating film 34, an organic EL element including a cathode electrode 60 connected to the drain electrode 32 through a contact hole, an electron transporting layer 58, a light emitting layer 56, a hole transporting layer 54 and an anode electrode 52, and a data bus line 72 connected to the source electrode 30 through a contact hole are formed.

On a transparent substrate 86 opposed to the transparent substrate 10, a data control circuit 82, a gate control circuit 84 and other outside circuits 88 are formed by the usual semiconductor fabrication process.

As shown in FIG. 7, the display substrate 70 and the outside circuit substrate 80 are bonded to each other with the terminal 72a of the data bus line 72 connected to the source electrode 30 and the terminal 82a of the data control circuit 82 interconnected to each other by a columnar electrode 62 and with the terminal 74a of a scan bus line (gate line) 74 connected to the gate electrode 18 and the terminal (not shown) of the gate control circuit 84 interconnected to each other by a columnar electrode (not shown).

In the same way as in the display device according to the first embodiment, a sealing compound (not shown) is provided between the display substrate 70 and the outside circuit substrate 80, enclosing the pixel region. Thus, the outside circuit substrate 80 can function as the protection film for protecting the organic EL element from the moisture in the outside atmosphere.

As described above, according to the present embodiment, the display device including a display unit and a drive unit, and having the protection function for protecting the organic EL element from the moisture in the outside atmosphere can be formed of two substrates. Thus, the display substrate and the outside circuit substrate which are laid on each other are wired, whereby the wiring length can be short. Thus, signal delay of the wiring and noises of electromagnetic waves and others can be reduced.

Figure 8:
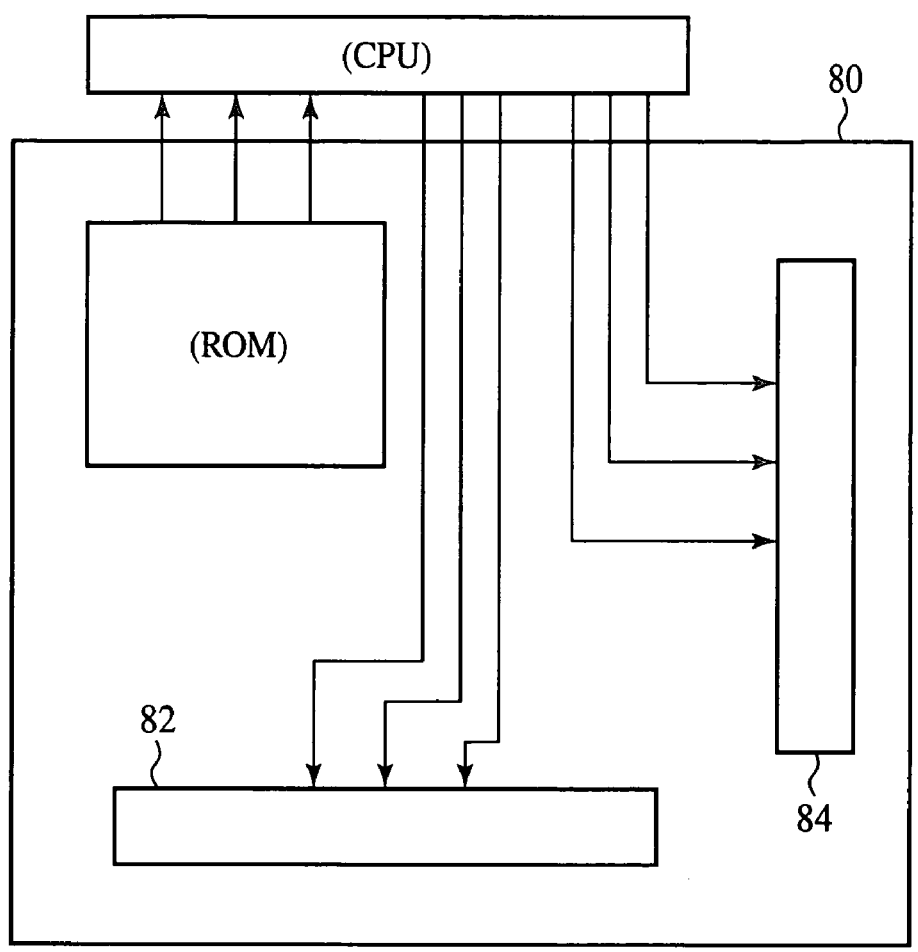
FIG. 8 is a plan view of the display device according to a modification of the second embodiment of the present invention, which shows the structure thereof.

In the present embodiment the outside circuit 88 of the outside circuit substrate 80 is the drive unit of the display device but may include circuits which are not directly related to the display function. As exemplified in FIG. 8, it is possible that the data control circuit 82 and the gate control circuit 84 are connected to a computer formed on another outside substrate by using a flexible substrate or others, and other circuit elements, such as a ROM, etc. connected to the computer are formed on the outside circuit substrate 80. It is also possible that ICs are mounted on the outside circuit substrate 80 by using a technique, such as COG or others.

When a large scale circuit using a region corresponding to the pixel region is formed on the outside circuit substrate 80, the bottom emission type display device as described in the present embodiment is required. When only circuits, such as the data control circuit 82, the gate control circuit 84, etc., which do not use the region corresponding to the pixel region, are formed on the outside circuit substrate 80, the top emission type display device may be used.

Figure 9:
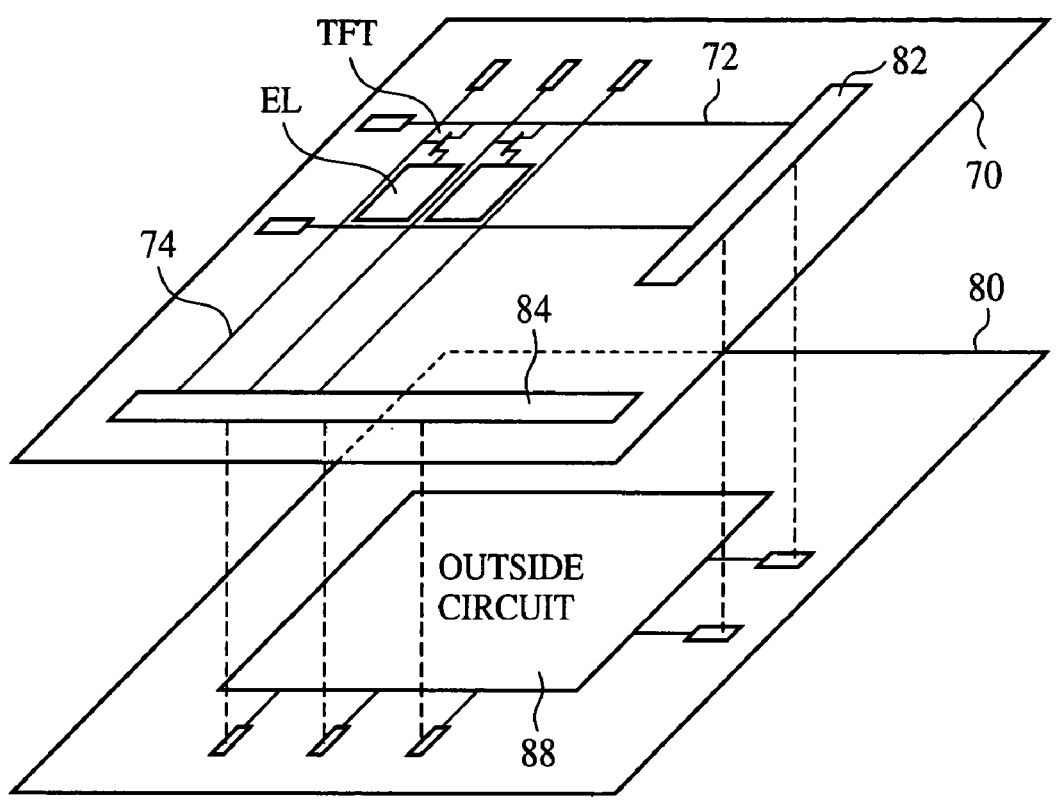
FIG. 9 is a perspective view of the display device according to a modification of the second embodiment of the present invention, which shows the structure thereof.

As shown in FIG. 9, the data control circuit 82 and the gate control circuit 84 may be formed on the display substrate 70. In this case, what are necessary to be supplied from the outside circuit substrate 80 to the display substrate 70 are only the source line and limited signal lines, as of clocks, data signals, etc. Accordingly, the electric connections between both substrates can be decreased, and the reliability decrease due to defective connections can be suppressed.

A Third Embodiment

The display device and the method for fabricating the same according to a third embodiment of the present invention will be explained with reference to FIG. 10. The same members of the present embodiment as those of the display device according to the first and the second embodiments shown in FIGS. 1 to 9 are represented by the same reference numbers not to repeat or to simplify their explanation.

Figure 10:
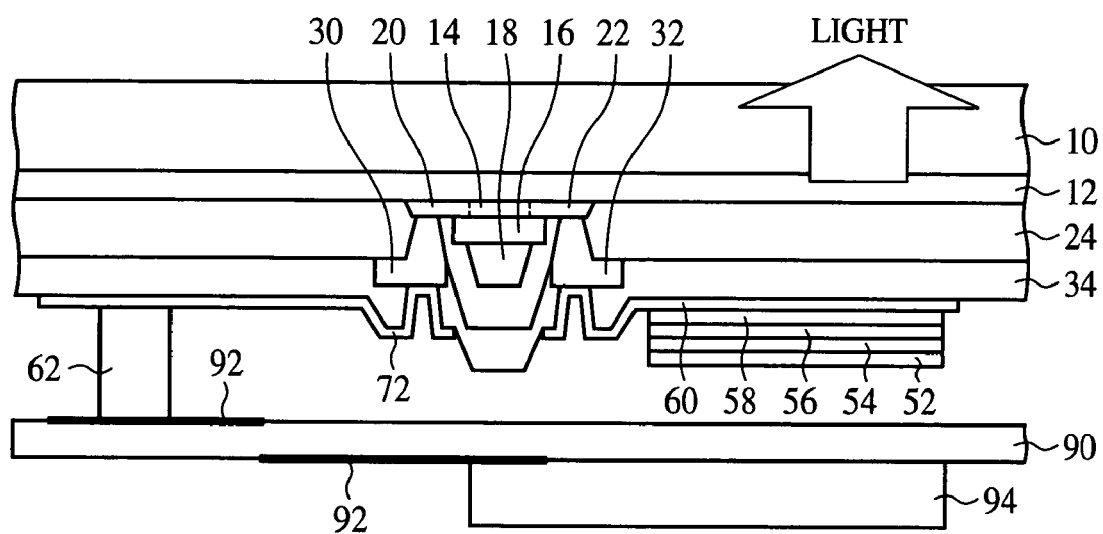
FIG. 10 is a diagrammatic sectional view of the display device according to a third embodiment of the present invention, which shows a structure thereof.

FIG. 10 is a diagrammatic sectional view of the display device according to the present embodiment, which shows a structure thereof.

The display device according to the present embodiment is characterized in that the display substrate 70 of the display device according to the second embodiment is bonded to a multi-level printed circuit board 90.

That is, as shown in FIG. 10, a buffer layer 12 is formed on a transparent substrate 10. A channel layer 14 is formed on the buffer layer 12. A gate electrode 18 is formed on the channel layer 14 with a gate insulating film 16 interposed therebetween. A source region 20 and a drain region 22 are formed in the channel layer 14 respectively on both sides of the gate electrode 18. Thus, a TFT including the gate electrode 18, and the source region 20 and the drain region 22 formed in the channel layer 14 is formed on the transparent substrate 10.

An inter-layer insulating film 24 is formed on the transparent substrate 10 with the TFT formed on. On the inter-layer insulating film 24, a source electrode 30 and a drain electrode 32 are formed, connected respectively to the source region 20 and the drain region 22 through contact holes.

An inter-layer insulating film 34 is formed on the inter-layer insulating film 24 with the source electrode 30 and the drain electrode 32 formed on. An organic EL element including a cathode electrode 60 connected to the drain electrode 32 through a contact hole, an electron transporting layer 58, a light emitting layer 56, a hole transporting layer 54 and an anode electrode 52, and a data bus line 72 connected to the source electrode 30 through a contact hole are formed on the inter-layer insulating film 34.

A interconnection layer 92 is formed on the surface of the multi-level printed circuit board 90, which is opposed to the display substrate 70. Electronic devices 94, such as ICs, etc., are mounted on a interconnection layer 92 which is on the surface of the multi-level printed circuit board 90, which is opposite to the surface thereof opposed to the display substrate 70.

As shown in FIG. 7, the display substrate 70 and the multi-level printed circuit board 90 are bonded to each other with the terminal 72a of the data bus line 72 connected to the source electrode 30, and the interconnection layer 92 formed on the surface of the multi-level printed circuit board 90 opposed to the display substrate 70 interconnected by a columnar electrode 62.

As in the same way as in the display device according to the first embodiment, a sealing compound (not shown) is provided between the display substrate 70 and the multi-level printed circuit board 90, enclosing the display region. Thus, the multi-level printed circuit board 90 can function as the protection film for protecting the organic EL element from the moisture in the outside atmosphere. To this end, it is necessary to note that the display device according to the present embodiment has no through-holes for mounting elements and parts remaining in the multi-level printed circuit board 90 at least when the display device is completed.

As described above, according to the present embodiment, the display device which includes the display unit and the drive unit and can function for protecting the organic EL element from the moisture in the outside atmosphere can be formed of two substrates. This can make the display device compact and can much reduce the mounted space. Furthermore, the display substrate and the multi-level printed circuit board are laid on each other and wired, which can shorten the wiring length and can reduce the signal delay of the wiring and noises of electromagnetic waves and others.

In the present embodiment, the electronic elements 94 are mounted on the interconnection layer 92 on the surface of the multi-level printed circuit board 90, which is opposite to the display substrate 70 but may be mounted on the interconnection layer 92 on the surface of the multi-level printed circuit board 90, which is opposed to the display substrate 70.

Modified Embodiments

The present invention is not limited to the above-described embodiments and can cover other various modifications.

For example, glass substrates are used as the substrate for the organic EL element to be formed on (transparent substrate 50) in the first embodiment, and the substrate for the outside circuit substrate 80 to be formed on (transparent substrate 86) in the second embodiment. However, it is not essential that the substrates are transparent. These substrates do not have to transmit the light emitted by the organic EL element and can be formed of another material, such as plastics, silicon or others.

Figure 11:
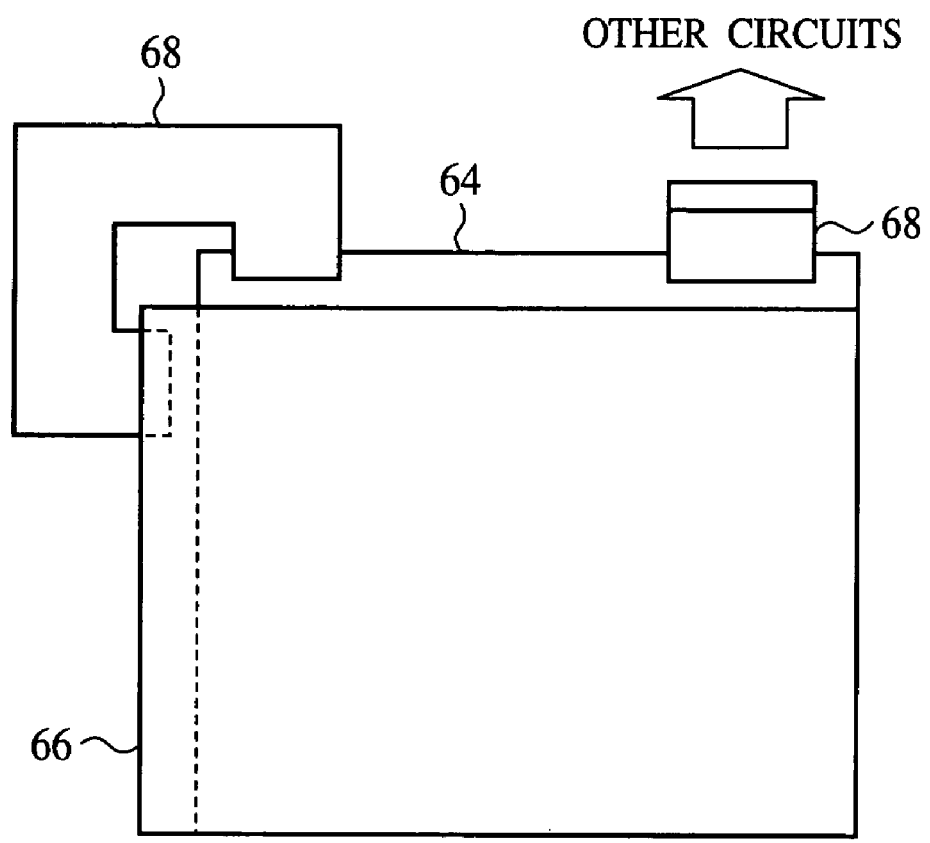
FIGS. 11 and 12 are plan views of the display device according to modifications of the embodiments of the present invention, which show structures thereof.
Figure 12:
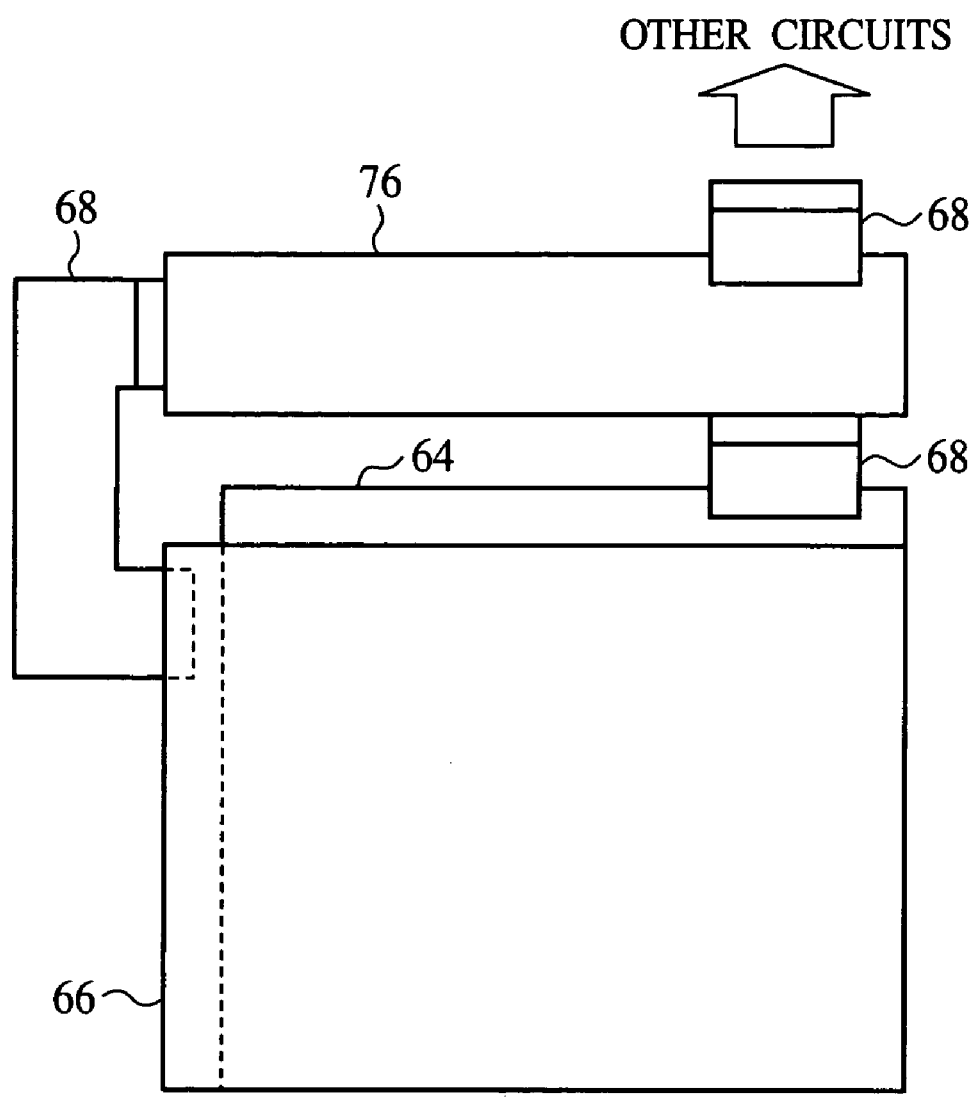

In the above-described embodiments, the two substrates are electrically connected to each other by columnar electrode. However, as shown in FIG. 11, a first substrate 64 and a second substrate 66 may be connected to each other by a flexible substrate 68. As exemplified in FIG. 12, the first substrate 64 and the second substrate 66 may be connected to each other by the flexible substrate 68 via a rigid substrate 76 provided in the connection. Circuits may be mounted on the flexible substrate 68 and the rigid substrate 76. In addition to the connection by means of the columnar electrode, the flexible substrate may be used for the connection.

In the above-described embodiments, the switching element is provided by the thin film transistor but may be another switching element. For example, a switching element of an MIM (metal-insulator-metal) structure using a diode, which is a two-terminal element, may be used.

In the above-described embodiments, the light emitting element is provided by the organic EL element but may be provided by another light emitting element. For example, an inorganic EL element, such as a light emitting diode or others, may be used.

What is claimed is:

1. A display device comprising:
   a first substrate having on one surface thereof:
   a plurality of light emitting elements, and
   a thin film transistor matrix for controlling the light emitting elements including a plurality of scan bus lines, a plurality of data bus lines intersecting the plurality of scan bus lines, and a plurality of thin film transistors arranged respectively at intersections between the plurality of scan bus lines and the plurality of data bus lines, and electrically connected to the respective plurality of the light emitting elements; and
   a second substrate having thereon a circuit for controlling the plurality of the thin film transistors, said second substrate being bonded to said one surface of the first substrate, and sealing a space where the plurality of the light emitting elements are formed.

2. A display device according to claim 1, wherein a scan bus line control circuit for controlling signals inputted into the plurality of scan bus lines, and a data bus line control circuit for controlling signals outputted from the plurality of data bus lines are formed on the first substrate.

3. A display device according to claim 2, wherein the second substrate is a printed circuit board.

4. A display device according to claim 1, wherein the circuit includes a scan bus line control circuit for controlling signals inputted into the plurality of scan bus lines, and a data bus line control circuit for controlling signals outputted from the plurality of data bus lines.

5. A display device according to claim 1, wherein the second substrate is a printed circuit board.

6. A display device according to claim 1, wherein the light emitting elements are organic EL elements.

7. A display device according to claim 1, wherein the first substrate and the second substrate are electrically connected to each other by columnar electrodes formed between the first substrate and the second substrate.

8. A display device according to claim 1, wherein the first substrate and the second substrate are electrically connected to each other by a flexible substrate.

9. A display device according to claim 1, wherein light emitted by the light emitting elements is taken out toward the other surface of the first substrate.

10. A display device according to claim 1, further comprising a sealing compound for sealing a gas within said space defined between said first substrate and said second substrate.

11. A display device according to claim 1, wherein the light emitting element and the thin film transistor are positioned so as to overlap in a normal direction of the first substrate and the second substrate.

12. A method for fabricating a display device comprising the steps of:

forming, on one surface of a first substrate, a plurality of light emitting elements and a thin film transistor matrix for controlling the light emitting elements including a plurality of scan bus lines, a plurality of data bus lines intersecting the plurality of scan bus lines, and a plurality of thin film transistors arranged respectively at intersections between the plurality of scan bus lines and the plurality of data bus lines and switching elements electrically connected to said respective plurality of light emitting elements;

forming, on one surface of a second substrate, a circuit for controlling the plurality of the thin film transistors which is to be electrically connected to said plurality of thin film transistors; and bonding the first substrate and the second substrate to each other with said one surface of the first substrate and said one surface of the second substrate opposed to each other to electrically connect the circuit to the plurality of switching elements.

13. A method for fabricating a display device according to claim 12, wherein in the step of bonding the first substrate and the second substrate to each other, the first substrate and the second substrate are bonded to each other, via a sealing compound, to seal a space where said plurality of light emitting elements are formed, and ,wherein a gas is sealed within said space.

* * * * *